United States Patent
Nakai

(10) Patent No.: US 8,274,031 B2
(45) Date of Patent: Sep. 25, 2012

(54) COLORED MICROLENS ARRAY AND MANUFACTURING METHOD FOR COLORED MICROLENS ARRAY, COLOR SOLID-STATE IMAGE CAPTURING DEVICE AND MANUFACTURING METHOD FOR COLOR SOLID-STATE IMAGE CAPTURING DEVICE, COLOR DISPLAY APPARATUS AND MANUFACTURING METHOD FOR COLOR DISPLAY APPARATUS, AND ELECTRONIC INFORMATION DEVICE

(75) Inventor: Junichi Nakai, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 979 days.

(21) Appl. No.: 12/204,053

(22) Filed: Sep. 4, 2008

(65) Prior Publication Data

US 2009/0127440 A1 May 21, 2009

(30) Foreign Application Priority Data

Sep. 5, 2007 (JP) ................................. 2007-230842

(51) Int. Cl.
H01L 27/14 (2006.01)
H01L 31/0232 (2006.01)
H01L 31/18 (2006.01)
H04N 5/335 (2011.01)
G02B 27/10 (2006.01)
B29D 11/00 (2006.01)

(52) U.S. Cl. ...................... 250/208.1; 250/226; 257/432; 257/E27.134; 438/70; 349/106; 359/620; 427/162; 216/24

(58) Field of Classification Search ................ 250/208.1, 250/226, 216; 257/432, E27.159, E27.134; 438/69, 70, 71, 75; 349/106; 359/619, 620; 216/24, 26; 427/162

See application file for complete search history.

(56) References Cited

U.S. PATENT DOCUMENTS

| | | | | |
|---|---|---|---|---|
| 5,466,926 | A * | 11/1995 | Sasano et al. | 250/216 |
| 5,605,783 | A * | 2/1997 | Revelli et al. | 430/321 |
| 5,948,281 | A * | 9/1999 | Okazaki et al. | 216/26 |
| 6,271,900 | B1 * | 8/2001 | Li | 349/95 |
| 6,297,911 | B1 * | 10/2001 | Nishikawa et al. | 359/619 |
| 6,433,844 | B2 * | 8/2002 | Li | 349/95 |
| 6,606,198 | B2 * | 8/2003 | Sasano et al. | 359/619 |
| 6,618,201 | B2 * | 9/2003 | Nishikawa et al. | 359/619 |
| 6,992,831 | B2 * | 1/2006 | Nagasawa et al. | 359/619 |
| 7,084,472 | B2 * | 8/2006 | Fukuyoshi et al. | 257/432 |
| 7,428,103 | B2 * | 9/2008 | Boettiger et al. | 359/619 |
| 7,476,562 | B2 * | 1/2009 | Boettiger et al. | 438/57 |
| 7,560,295 | B2 * | 7/2009 | Boettiger et al. | 438/22 |
| 7,569,315 | B2 * | 8/2009 | Yamamoto | 430/7 |
| 7,579,209 | B2 * | 8/2009 | Kim | 438/71 |

(Continued)

FOREIGN PATENT DOCUMENTS

JP 03-230101 10/1991

(Continued)

*Primary Examiner* — John Lee
(74) *Attorney, Agent, or Firm* — David G. Conlin; Steven M. Jensen; Edwards Wildman Palmer LLP

(57) ABSTRACT

A colored microlens array includes a plurality of microlenses for focusing incident light on a plurality of respective positions, on a substrate or a transparent film provided on the substrate, in which peripheral sections of the plurality of microlenses overlap each other at the adjacent positions and the microlenses are colored in a plurality of colors and arranged in a predetermined color arrangement.

14 Claims, 9 Drawing Sheets

U.S. PATENT DOCUMENTS

| | | | |
|---|---|---|---|
| 7,652,821 B2 * | 1/2010 | Boettiger et al. | 359/619 |
| 7,683,302 B2 * | 3/2010 | Yokozawa | 250/208.1 |
| 7,800,716 B2 * | 9/2010 | Ishibe | 349/106 |
| 7,879,390 B2 * | 2/2011 | Salleo et al. | 427/162 |
| 7,916,204 B2 * | 3/2011 | Wells et al. | 348/340 |
| 7,989,752 B2 * | 8/2011 | Yokozawa | 250/208.1 |
| 2003/0202244 A1 * | 10/2003 | Brady et al. | 359/456 |
| 2004/0058063 A1 * | 3/2004 | Okada et al. | 427/162 |
| 2004/0185588 A1 * | 9/2004 | Fukuyoshi et al. | 438/22 |
| 2004/0196560 A1 * | 10/2004 | Nagasawa et al. | 359/619 |
| 2006/0077268 A1 * | 4/2006 | Yokozawa | 348/272 |
| 2006/0245066 A1 * | 11/2006 | Aizenberg et al. | 359/622 |
| 2007/0102621 A1 * | 5/2007 | Kim | 250/208.1 |
| 2007/0298164 A1 * | 12/2007 | Ogata et al. | 427/162 |
| 2008/0225424 A1 * | 9/2008 | New | 359/893 |
| 2009/0015767 A1 * | 1/2009 | Ishibe | 349/106 |
| 2009/0127440 A1 * | 5/2009 | Nakai | 250/227.2 |
| 2009/0278220 A1 * | 11/2009 | Kim | 257/432 |
| 2010/0134663 A1 * | 6/2010 | Yokozawa | 348/273 |

FOREIGN PATENT DOCUMENTS

| | | |
|---|---|---|
| JP | 04-012568 | 1/1992 |
| JP | 05-206429 | 8/1993 |
| JP | 11-284162 | 10/1999 |
| JP | 2003-332547 | 11/2003 |
| JP | 2005-326700 | 11/2005 |
| JP | 2006-323113 | 11/2006 |

* cited by examiner

FIG.2
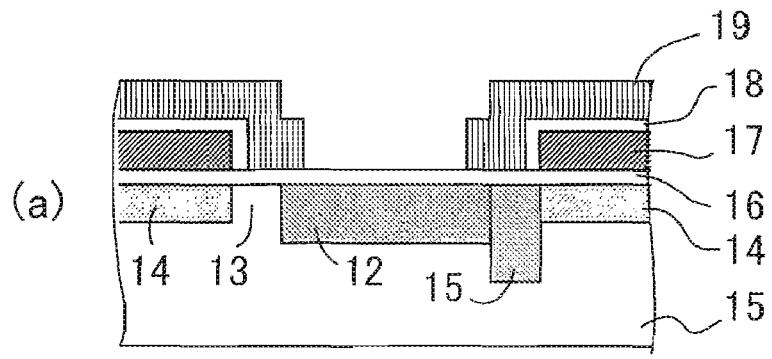
(a)
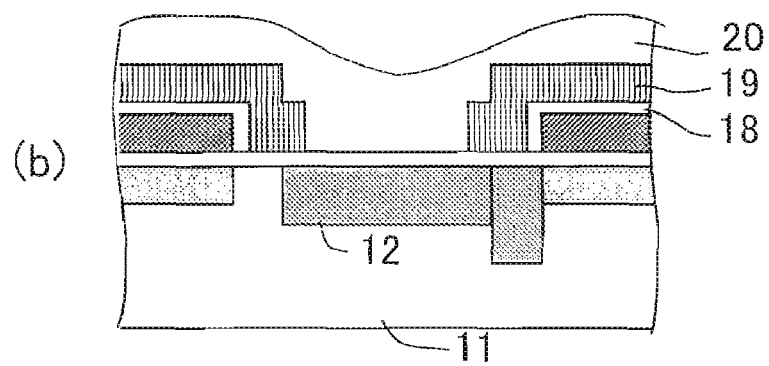
(b)
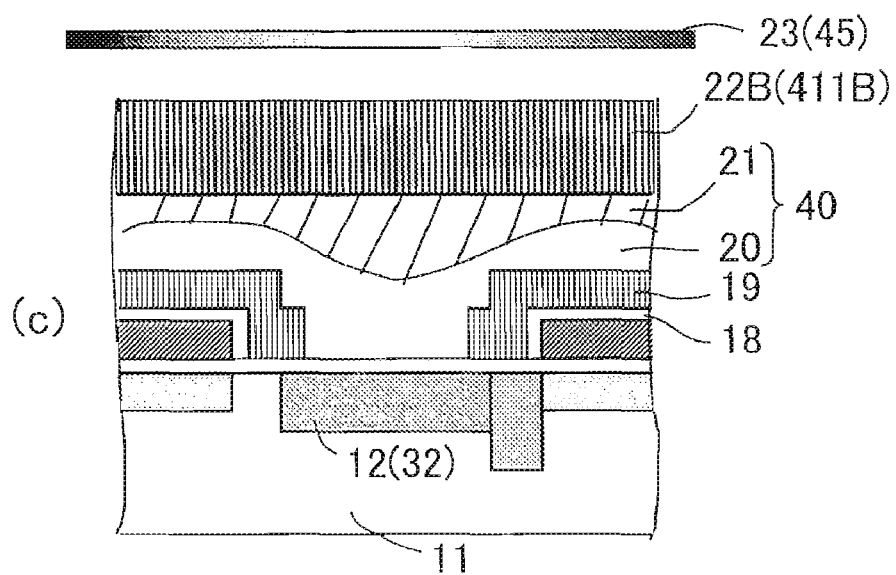
(c)

FIG.3
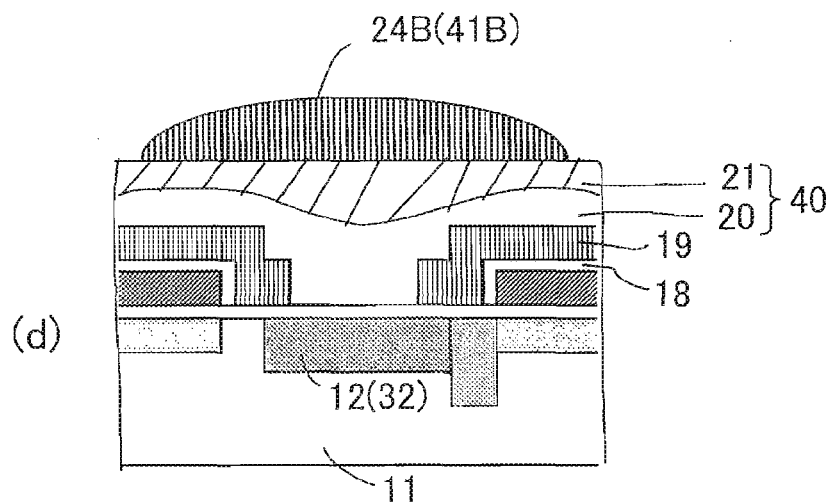
(d)
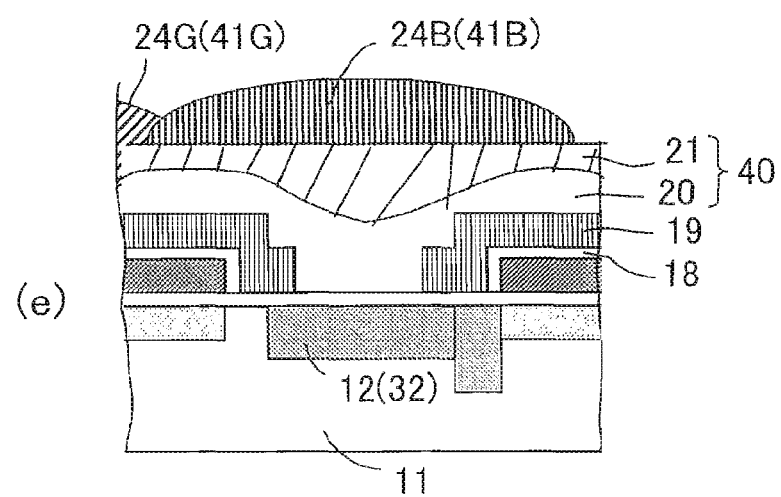
(e)
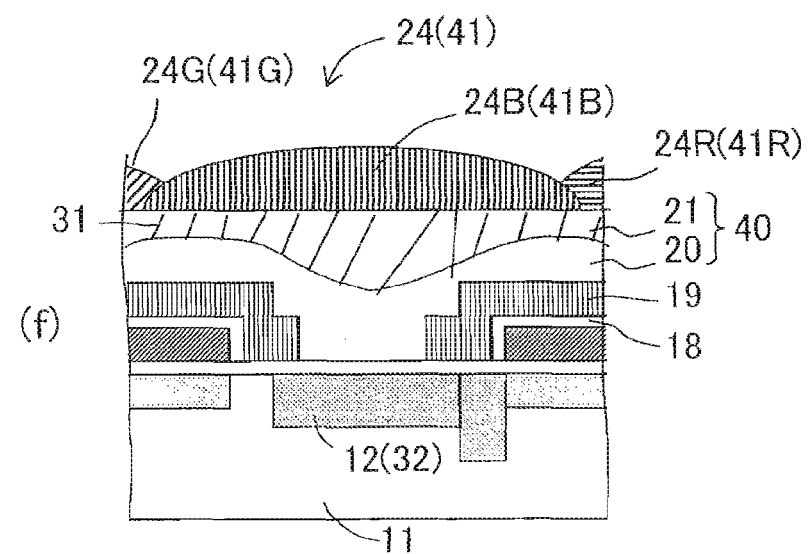
(f)

FIG.4
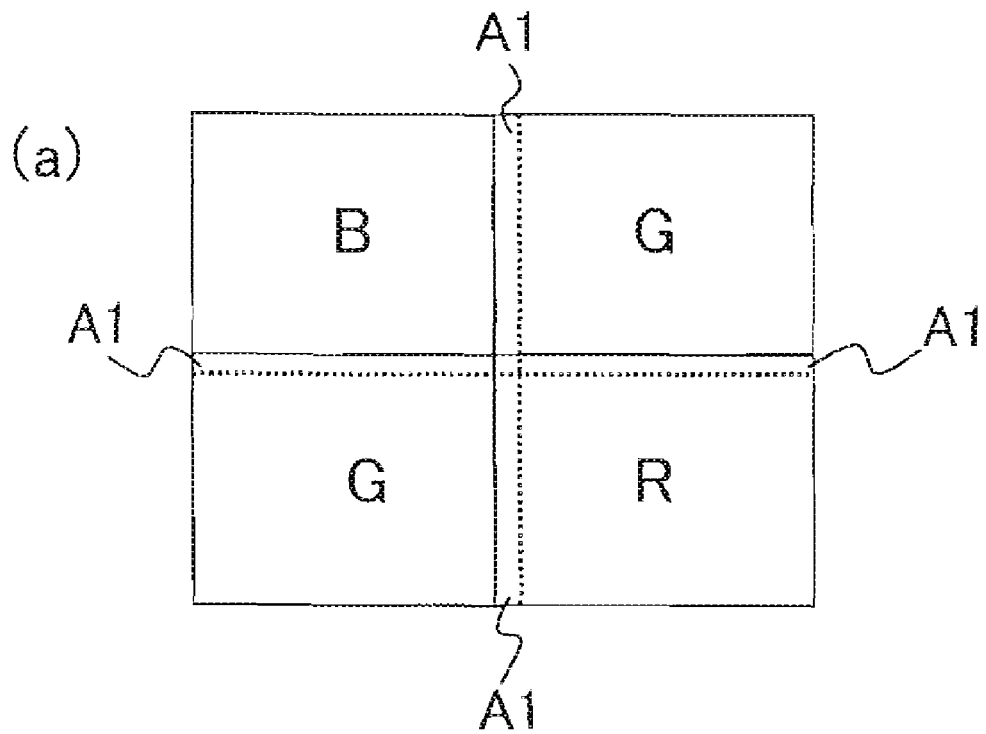
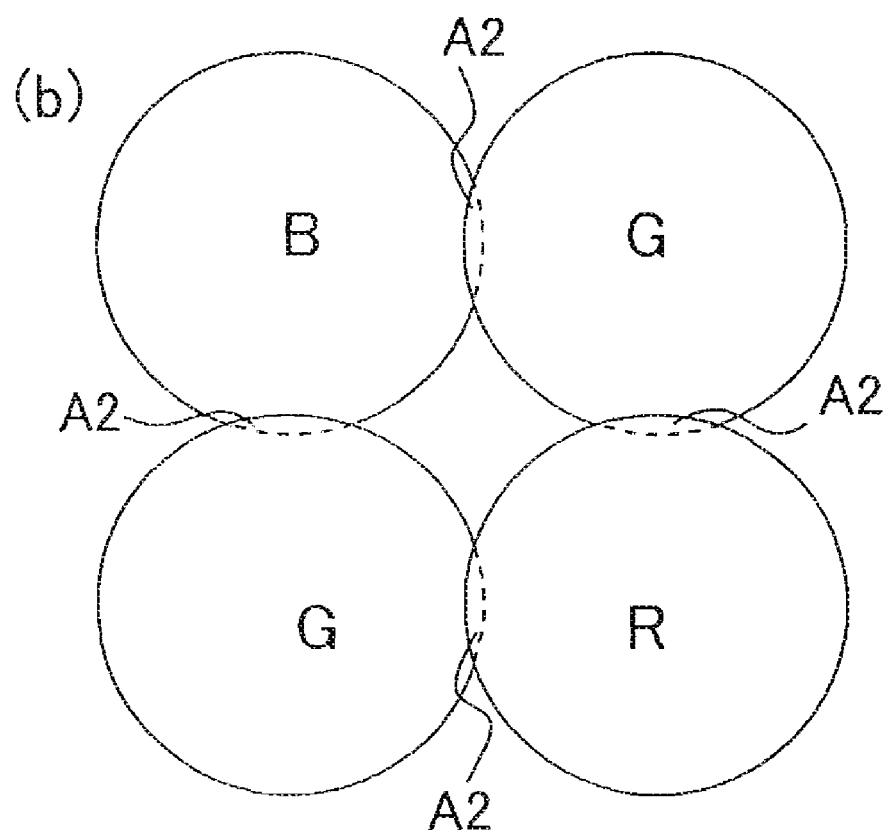

FIG.8
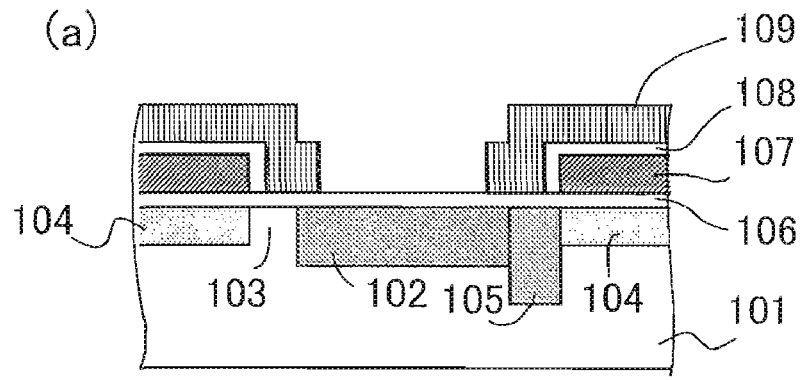
(a)
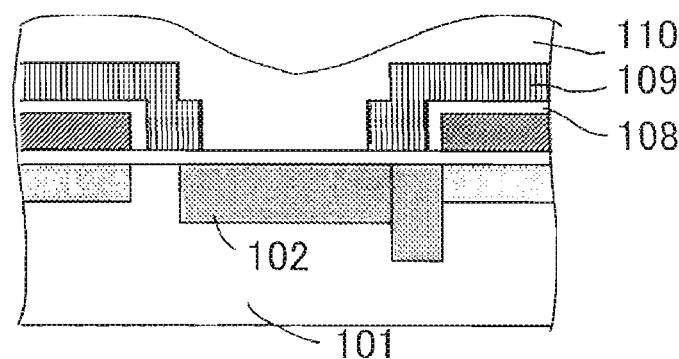
(b)
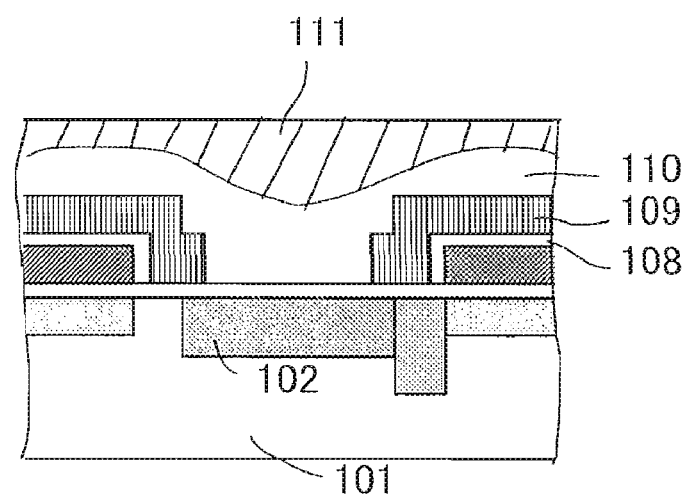
(c)

COLORED MICROLENS ARRAY AND MANUFACTURING METHOD FOR COLORED MICROLENS ARRAY, COLOR SOLID-STATE IMAGE CAPTURING DEVICE AND MANUFACTURING METHOD FOR COLOR SOLID-STATE IMAGE CAPTURING DEVICE, COLOR DISPLAY APPARATUS AND MANUFACTURING METHOD FOR COLOR DISPLAY APPARATUS, AND ELECTRONIC INFORMATION DEVICE

This Nonprovisional application claims priority under 35 U.S.C. §119(a) on Patent Application No. 2007-230842 filed in Japan on Sep. 5, 2007, the entire contents of which are hereby incorporated by reference.

BACKGROUND OF THE INVENTION

1. Field of the Invention

The present invention relates to a colored microlens array for focusing incident light at a plurality of positions by a predetermined color arrangement such as Bayer arrangement and a manufacturing method for the colored microlens array. In particular, the present invention relates to a colored microlens array for a colored microlens and an inner-layer lens used for a color solid-state image capturing apparatus consisting of semiconductor elements for performing photoelectric conversions on and capturing image light from a subject, used for a color liquid crystal display apparatus, and a manufacturing method for the colored microlens array; a color solid-state image capturing device using the colored microlens array and a manufacturing method for the color solid-state image capturing device; a color display apparatus such as a color liquid crystal display apparatus using the colored microlens array and a manufacturing method for the color display apparatus; and an electronic information device, such as a digital camera (e.g., digital video camera and digital still camera), an image input camera, a scanner, a facsimile machine and a camera-equipped cell phone device, having the color solid-state image capturing device as an image input device used in an image capturing section of the electronic information device.

2. Description of the Related Art

In recent years, a color solid-state image capturing device using a semiconductor element (e.g., CCD (Charge Coupled Device) image sensor, CMOS (Complementary Metal Oxide Semiconductor) image sensor) is used variously as an electronic information device of a finished product, such as a digital camera, a video camera, a camera-equipped cell phone device, a scanner, a digital copying machine, and a fax machine. With the spread of the color solid-state image capturing device, the demand for not only high-functioning and high-performance, such as more number of pixels and more light receiving sensitivity, but also downsizing and lower pricing are increasing still more.

With the advancement of downsizing and more number of pixels (more pixels and more dense pixels) for the color solid-state image capturing device as well as the demand for lower pricing, the size of the pixel installed in the color solid-state image capturing device becomes even smaller. With such a reduction of the pixel, the light receiving sensitivity decreases, which is one of the fundamental performances of the color solid-state image capturing device. As a result, a clear image capturing of a subject will be difficult in a place with low luminous intensity. Therefore, it is important how to increase the light receiving sensitivity per unit pixel.

As a method for increasing the sensitivity of the color solid-state image capturing device, techniques, such as forming a microlens, which is composed of an organic high molecule material, on a color filter (Reference 1, for example), and further forming a lens under a color filter and inside a laminated structure between a light receiving section and the color filter for positioning a so-called inner-layer lens (Reference 2, for example), are known.

Such a microlens and inner-layer lens increase the light focusing rate for incident light entering vertically onto the light receiving section, thereby increasing the sensitivity of a solid-state image capturing element (light receiving section). However, the focal point comes off the center of the light receiving section for incident light entering obliquely, which has a non-vertical incident angle. In particular, the amount of light decreases in a peripheral section of the light receiving section, causing poor image quality. This phenomenon becomes more noticeable as the distance increases between the microlens and the light receiving section, relatively with the miniaturization of the pixel.

Therefore, what is required as a function of the color solid-state image capturing device with more downsizing and more impacted pixels, is a way to improve the light receiving sensitivity by the microlens and the inner-layer lens, and at the same time, a way to maintain a short distance between the microlens and the light receiving section described above. As such a technique, Reference 3 proposes a forming method for a colored microlens array on a CCD. The forming method for the colored microlens array will be described with reference to FIG. 8.

First, a light receiving section 102, a CCD charge transfer channel 104, and a channel stopper 105 are respectively formed on a surface of a semiconductor substrate 101, as illustrated in FIG. 8(*a*). The light receiving section 102 performs photoelectric conversions on and captures image light from a subject, functioning as a photoelectric conversion section. The CCD charge transfer channel 104 reads out a signal charge from the light receiving section 102 through a readout section 103 so as to consecutively transfer the signal charge in a predetermined direction. The channel stopper 105 separates the periphery of one element including the light receiving section 102 and the CCD charge transfer channel 104. Further, a charge transfer electrode 107 is formed above the CCD transfer channel 102 with an insulation film 106 interposed therebetween. Further, an interlayer insulation film 108 is formed on the charge transfer electrode 107, and a shielding film 109 is formed in such a manner to avoid covering the light receiving section 102.

Subsequently, a first planarizing film 110, such as BPSG (Boro-Phospho-Silicate Glass), is layered on the insulation film 106 and the light shielding film 109 as illustrated in FIG. 8(*b*). The surface is smoothed by a second planarizing film 111 as illustrated in FIG. 8(*c*). Subsequently, a color filter array 112 is formed by a pigment dispersed resist or dye method on the second planarizing film 111 as illustrated in FIG. 9(*d*), the color filter array 112 having a blue color filter 112B, a green color filter 112G, and a red color filter 112R coupled in a mosaic and arranged by the Bayer arrangement. Subsequently, a microlens shape pattern 113, which is a transfer resist pattern, is formed to be positioned above the corresponding light receiving section 102 functioning as a photoelectric conversion section as illustrated in FIG. 9(*e*), the microlens shape pattern 113 formed in a lens shape similar to a convex-shaped microlens shape using an organic high molecule material.

Using the microlens shape pattern 113 as a mask, respective color filters 112B, 112G and 112R are etched simultaneously by anisotropy etching such as RIE (Reactive Ion Etching), so that color filters 112B, 112G and 112R are formed in such a manner to be copied in respective convex-shaped lenses, as illustrated in FIG. 9(f). As a result, a colored microlens array is formed, the colored microlens array composed of colored microlenses 114B, 114G and 114R that are colored in each color and positioned above corresponding light receiving sections 102 functioning as a photoelectric conversion section.

Reference 1: Japanese Publication for Opposition No. 2945440

Reference 2: Japanese Laid-Open Publication No. 11-40787

Reference 3: Japanese Laid-Open Publication No. 5-206429

SUMMARY OF THE INVENTION

The conventional forming method for the colored microlens array 114 has the following problems.

First, it is extremely difficult to equally maintain the space between adjacent patterns at or below 0.1 μm due to limitation of the manufacture because the microlens shape pattern 113, which is used for forming the colored microlens, is formed by reflow by heating. Further, the anisotropy etching is performed on the color filter array 112 with the microlens shape pattern 113 as a mask so as to copy and form the color filter array 112 into a convex lens shape. Therefore, the spaces between complete adjacent colored microlenses 114B, 114G and 114R become even wider and the space of 0.1 μm is the minimum limit. Accordingly, the spaces between the colored microlenses 114B, 114G and 114R are wide (zero space is ideal), resulting in less lens area, poor use efficiency of the incident light, and a difficulty in improving the light receiving sensitivity of the conventional color solid-state image capturing device.

In general, the plasma etching rate of the color filter array 112 is influenced by the chemical structure of the coloring matter of pigment, dye and the like contained in the color filter array 112. Particularly, metal phthalocyanine pigment contained in the blue color filter 112B has plasma resistance among blue (B), green (G) and red (R) color filters, and therefore, the etching rate for the color filter 112B is lower than the etching rate for the color filters 112G and 112R. As a result, respective shapes of the colored microlenses 114B, 114G and 114R will be different and the lens shapes for respective colors will not be uniform when the anisotropy etching is performed on the color filter array 112 at the same time under the same condition using the identical-shaped microlens shape pattern 113. In such a case, the microlens 114B will be the thickest. Therefore, the image quality of the conventional solid-state image capturing apparatus may be decreased due to the difference in the shapes of the microlenses 114B, 114G and 114R.

The present invention is intended to solve the conventional problems described above. The objective of the present invention is to provide a colored microlens array which is capable of obtaining zero space between adjacent microlenses and uniform and optimum lens shape for each color; the manufacturing method for the colored microlens array; and a color solid-state image capturing device using the colored microlens array and the manufacturing method for the color solid-state image capturing device. Further, the objective of the present invention is to provide a color display apparatus using the color solid-state image capturing device and the manufacturing method for the color display apparatus; and an electronic information device using the color solid-state image capturing device as an image input device in an image capturing section.

A colored microlens array according to the present invention includes a plurality of microlenses for focusing incident light on a plurality of respective positions, on a substrate or a transparent film provided on the substrate, in which peripheral sections of the plurality of microlenses overlap each other at the adjacent positions and the microlenses are colored by each color in a plurality of colors and arranged in a predetermined color arrangement, thereby achieving the objective described above.

Preferably, in a colored microlens array according to the present invention, the predetermined color arrangement is a color arrangement of complementary colors of cyan, yellow and magenta, or a color arrangement of primary colors.

Still preferably, in a colored microlens array according to the present invention, as one of the plurality of colors in the color arrangement of the complementary colors, the magenta is defined to be colorless with no coloring.

Still preferably, in a colored microlens array according to the present invention, the plurality of microlenses are inner-layer microlenses, each surface of which is provided in a transparent film.

Still preferably, in a colored microlens array according to the present invention, pigment or dye is dispersed in the plurality of microlenses.

Still preferably, in a colored microlens array according to the present invention, coloring matter is contained in the plurality of microlenses.

Still preferably, in a colored microlens array according to the present invention, a material for forming the plurality of microlenses includes a photosensitive material.

Still preferably, in a colored microlens array according to the present invention, a lens shape of the plurality of microlenses is determined in accordance with the plurality of colors in the predetermined color arrangement.

A method for manufacturing a colored microlens array includes: a photosensitive material forming step of evenly forming a photosensitive material colored with pigment or dye, on a substrate or a transparent film formed on the substrate; and a lens shape forming step of irradiating light selectively on a predetermined portion of the photosensitive material and subsequently performing development processing to form a surface of the photosensitive material into a lens shape, thereby achieving the objective described above.

Preferably, in a method for manufacturing a colored microlens array according to the present invention, a masking means having light transmissivity adjusted incrementally or consecutively by a light shielding film is used in the lens shape forming step so as to form a plurality of microlenses into respective lens shapes when the surface of the photosensitive material is formed into a lens shape by selectively irradiating light on a predetermined portion of the photosensitive material.

Still preferably, in a method for manufacturing a colored microlens array according to the present invention, the plurality of microlens are formed such that the peripheral sections of the adjacent microlenses overlap each other and the microlenses are colored in a plurality of colors and arranged in a predetermined color arrangement.

Still preferably, in a method for manufacturing a colored microlens array according to the present invention, in the plurality of microlenses, the lens shape is formed in accordance with the plurality of colors in the color arrangement.

A colored microlens array according to the present invention is manufactured by the method for manufacturing a colored microlens array according to the present invention, thereby achieving the objective described above.

A color solid-state image capturing device includes a plurality of light receiving elements provided in two dimensions for performing photoelectric conversion on image light from a subject, in which a colored microlens array according to the present invention is provided above light receiving sections with a transparent film interposed therebetween, for focusing incident light on light receiving sections, thereby achieving the objective described above.

Preferably, in a color solid-state image capturing device according to the present invention, the color solid-state image capturing device is a CCD color solid-state image capturing device, in which a photoelectrically converted signal charge in each of the light receiving elements is read out in a charge transfer section to be consecutively transferred in a predetermined direction.

Still preferably, in a color solid-state image capturing device according to the present invention, the color solid-state image capturing device is a CMOS color solid-state image capturing device, in which a photoelectrically converted signal charge in each of the light receiving elements is transferred to a charge detection section, and the signal charge is converted into voltage in the charge detection section to be amplified in accordance with the converted voltage and outputted as an image capturing signal.

A method for manufacturing a color solid-state image capturing device includes a plurality of light receiving elements provided in two dimensions for performing photoelectric conversion on image light from a subject, the method including a step of forming a colored microlens array by above-mentioned method for manufacturing a colored microlens array, thereby achieving the objective described above.

Preferably, in a method for manufacturing a color solid-state image capturing device according to the present invention, the method for manufacturing a color solid-state image capturing device is a method for manufacturing a CCD color solid-state image capturing device, in which a photoelectrically converted signal charge in each of the light receiving elements is read out in a charge transfer section to be consecutively transferred in a predetermined direction.

Still preferably, in a method for manufacturing a color solid-state image capturing device according to the present invention, wherein the method for manufacturing a color solid-state image capturing device is a method for manufacturing a CMOS color solid-state image capturing device, in which a photoelectrically converted signal charge in each of the light receiving elements is transferred to a charge detection section, and the signal charge is converted into voltage in the charge detection section to be amplified in accordance with the converted voltage and outputted as an image capturing signal.

A color solid-state image capturing device according to the present invention is manufactured by the method for manufacturing the color solid-state image capturing device according to the present invention, thereby achieving the objective described above.

A color solid-state image capturing device according to the present invention is manufactured by a method for manufacturing a color solid-state image capturing device according to the present invention, thereby achieving the objective described above.

A color display apparatus according to the present invention has a colored microlens in a colored microlens array according to the present invention, provided for each display pixel in a display panel.

A method for manufacturing a color display apparatus according to the present invention includes a step of forming a colored microlens array by a method for manufacturing a colored microlens array according to the present invention, in which each colored microlens in the colored microlens array is formed in a display panel for each display pixel, thereby achieving the objective described above.

A color display apparatus according to the present invention is manufactured by the method for manufacturing the color solid-state image capturing device according to the present invention, thereby achieving the objective described above.

An electronic information device according to the present invention uses a color solid-state image capturing device according to the present invention as an image input device in an image capturing section, thereby achieving the objective described above.

The functions of the present invention having the structures described above will be described hereinafter.

According to the present invention, a photosensitive material, which is colored with pigment or dye as necessary, is evenly formed on a substrate or a transparent film provided on the substrate. An appropriate amount of ultraviolet rays is selectively irradiated at a predetermined portion of the photosensitive material using a reticle plate and the like, the reticle plate functioning as a masking means for selectively irradiating appropriate amount of ultraviolet rays at a predetermined portion of the photosensitive material or for adjusting the transmissivity of light incrementally or continuously as necessary so as to form a lens pattern shape. Subsequently, development processing is performed for the photosensitive material irradiated with ultraviolet rays so as to form the surface in a lens shape. As a result, a colored microlens array is consecutively formed where various colors, such as three primary colors of blue colored microlens, green colored microlens, and red colored microlens, are colored and arranged. In the microlens array, the peripheral sections of respective microlenses overlap with each other and have a microlens shape that meets a required performance of the device and in accordance with each color. With such a structure, an optimum lens shape can be obtained with zero space between adjacent microlenses and with uniformity for each lens. Further, the distance between the microlens and the light receiving section can be shortened, so that the colored microlens array can be obtained with good uniformity for each color and with high quality and high performance.

According to the present invention with the structure described above, a photosensitive material, which is colored with pigment or dye as necessary, is evenly formed on a substrate or a transparent film provided on the substrate. An appropriate amount of ultraviolet rays is selectively irradiated at a predetermined portion of the photosensitive material, or appropriate amount of ultraviolet rays is selectively irradiated by a masking means for adjusting the transmissivity of light incrementally or continuously as necessary. Subsequently, a developing process is performed for the photosensitive material irradiated with ultraviolet rays so as to form the surface in a lens shape. As a result, the peripheral sections of respective microlenses overlap with each other, and such a microlens shape meets a required performance of the device. The distance between the microlens and the light receiving section becomes short and desirable. With such a structure, the colored microlens array can be obtained with good uniformity for each color and with high quality and high performance.

These and other advantages of the present invention will become apparent to those skilled in the art upon reading and understanding the following detailed description with reference to the accompanying figures.

BRIEF DESCRIPTION OF THE DRAWINGS

FIGS. 2(a) to (c) are longitudinal cross sectional views schematically illustrating an exemplary unit pixel to describe respective steps (first half) of a manufacturing method for the CCD solid-state image capturing device of FIG. 1.

FIGS. 3(d) to (f) are longitudinal cross sectional views schematically illustrating an exemplary unit pixel to describe respective steps (latter half) of a manufacturing method for the CCD solid-state image capturing device of FIG. 1.

FIG. 4(a) is a top view schematically illustrating four square colored microlens array according to the present invention. FIG. 4(b) is a top view schematically illustrating four round colored microlens array according to the present invention.

FIGS. 8(a) to (c) are longitudinal cross sectional views schematically illustrating an exemplary unit pixel to describe respective steps (first half) of a conventional manufacturing method for the CCD solid-state image capturing device.

Figure 1:
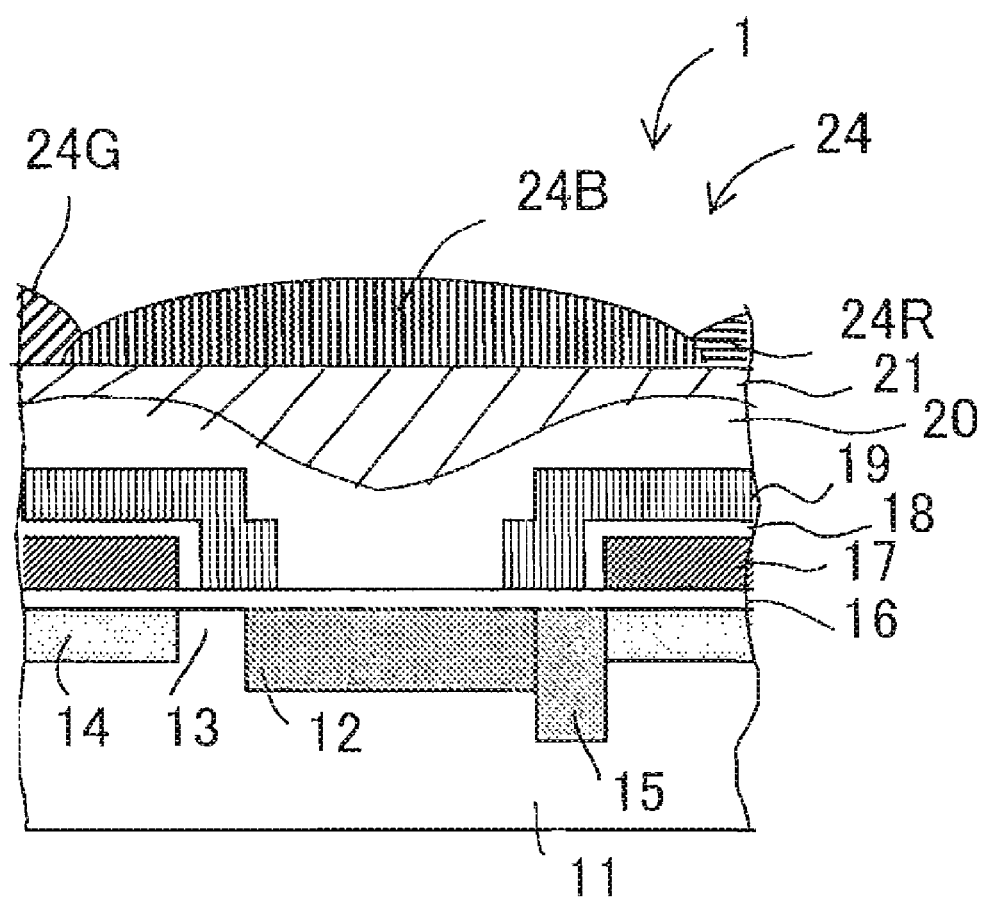
FIG. 1 is a longitudinal cross sectional view schematically illustrating an exemplary unit pixel structure in a CCD solid-state image capturing device of Embodiment 1 that uses the colored microlens array according to the present invention.

1, 2 CCD solid-state image capturing device
3 CMOS solid-state image capturing device
4 electronic information device
11, 31 semiconductor substrate
12, 32 light receiving section (photoelectric conversion section)
14, 34 CCD transfer channel
13, 33 readout section
15, 35 channel stopper
16, 36 insulation film
17, 37 charge transfer electrode
18, 38 interlayer insulation film
19, 39 light shielding film
20, 40 first planarizing film
21, 42 second planarizing film
24, 41 colored microlens array
24B, 41B blue colored microlens
24G, 41G green colored microlens
24R, 41R red colored microlens
41 inner-layer colored microlens array
41B blue colored inner-layer microlens
41G green colored inner-layer microlens
41R red colored inner-layer microlens
51 N-type substrate
52 P-type well region
53 light receiving section
54 P-type separation region
55 first-layer metal wiring layer
56 second-layer metal wiring layer
57 third-layer metal wiring layer
58 interlayer insulation film
59 colored microlens array
59B blue colored microlens
59G green colored microlens
59R red colored microlens
61 solid-state image capturing apparatus
62 memory section
63 display section
64 communication section
65 image output section

DESCRIPTION OF THE PREFERRED EMBODIMENTS

Hereinafter, a colored microlens array according to the present invention and a manufacturing method for such a colored microlens array will be described with reference to the accompanying figures. Embodiment 1 will be a case where the colored microlens array according to the present invention and the manufacturing method for the colored microlens array are applied for a CCD solid-state image capturing device (CCD image sensor) and a manufacturing method for the CCD solid-state image capturing device. Embodiment 2 will be a case where the colored microlens array according to the present invention and the manufacturing method for the colored microlens array are applied for a CCD solid-state image capturing device and a manufacturing method for the CCD solid-state image capturing device as an inner-layer colored lens array. Embodiment 3 will be a case where the colored microlens array according to the present invention and the manufacturing method for the colored microlens array are applied for a CMOS solid-state image capturing device (CMOS image sensor) and a manufacturing method for the CMOS solid-state image capturing device. Further, Embodiment 4 will be an electronic information device in which the solid-state image capturing device according to any of Embodiment 1 to 3 will be used in an image capturing section.

Embodiment 1

FIG. 1 is a longitudinal cross sectional view schematically illustrating an exemplary one-pixel structure in the CCD solid-state image capturing device of Embodiment 1 that uses the colored microlens array according to the present invention.

In FIG. 1, a CCD solid-state image capturing device 1 according to Embodiment 1 includes a plurality of light receiving sections 12 provided in a matrix on a surface of a semiconductor substrate 11, the light receiving sections 12 functioning as a plurality of photoelectric conversions section for performing photoelectric conversions on and capturing image light from a subject. A CCD charge transfer channel 14 is provided adjacent to the light receiving section 12 with a readout section 13 interposed therebetween, the CCD charge transfer channel 14 functioning to read out a signal charge from the light receiving section 12 through the readout section 13 and consecutively transfer the signal charge in a predetermined direction (either vertical or horizontal direction). In addition, a channel stopper 15 for element separation is provided in the periphery of the CCD charge transfer channel 14. A charge transfer electrode 17 is provided on the CCD charge transfer channel 14 with an insulation film 16 interposed therebetween. A light shielding film 19 is provided on the charge transfer electrode 17 with an interlayer insulation film 18 interposed therebetween, the light shielding film 19 formed in such a manner to avoid covering above the light receiving section 12. Further, a first planarizing film 20 is provided on the light shielding film 19, and a second planarizing film 21 is provided on the first planarizing film 20, the second planarizing film 21 having a refractive index greater than that of the first planarizing film 20 and equipped with a lens function for the light receiving section 12.

Further, on the second planarizing film 21 as a transparent film, a blue colored microlens 24B, a green colored microlens 24G and a red colored microlens 24R are provided with a predetermined color arrangement such as Bayer arrangement in such a manner to be in a two dimensional matrix and correspond to respective light receiving sections 12. The peripheral sections of the colored microlenses overlap with each other, and each of the colored microlenses is colored with any one of the three primary colors.

A manufacturing method for the CCD solid-state image capturing device 1 with the structure described above will be described herein.

FIGS. 2(a) to (c) and FIGS. 3(d) to (f) are longitudinal cross sectional views schematically illustrating an exemplary unit pixel structure in each step so as to consecutively explain the manufacturing method for the CCD solid-state image capturing device 1 in FIG. 1.

First, a light receiving section 12, a CCD charge transfer channel 14, and a channel stopper 15 are respectively formed on a surface of a semiconductor substrate 11, as illustrated in FIG. 2(a). The light receiving section 12 performs photoelectric conversions on and captures image light from a subject, functioning as a photoelectric conversion section. The CCD charge transfer channel 14 reads out a signal charge from the light receiving section 12 through a readout section 13 so as to consecutively transfer the signal charge in a predetermined direction (longitudinal or transverse direction). The channel stopper 15 separates the periphery of one element including the light receiving section 12 and the CCD charge transfer channel 14. Further, a charge transfer electrode 17 is formed above the CCD transfer channel 12 with an insulation film 16 interposed therebetween. Further, an interlayer insulation film 18 is formed on the charge transfer electrode 17, and a shielding film 19, which is composed of a metal material such as tungsten, is formed to prevent light from breaking through into the charge transfer section, in such a manner to avoid covering the light receiving section 12.

Next, a first planarizing film 20 composed of BPSG is layered on the insulation film 16 and the light shielding film 19 as illustrated in FIG. 2(b), and the surface, which is concave above the light receiving section 12 and is convex above the charge transfer electrode 17, is smoothed by a second planarizing film 21 as illustrated in FIG. 2(c). The second planarizing film 21 may have a higher refractive index than that of the first planarizing film 20 so that the second planarizing film 21 will also have a lens effect. Further, a negative-type blue resist 22B photosensitive to ultraviolet rays, for example, is formed as a first colored resist on the second planarizing film 21. Subsequently, a blue colored microlens 24B, which has a lens shape as illustrated in FIG. 3(d), is formed by using a reticle plate 23 for exposing, which is a masking means for selectively and suitably irradiating ultraviolet light above the light receiving section 12 functioning as a photoelectric conversion section for the Blue color. In this case, the reticle plate 23 is used as a masking means to consecutively adjust the transmissivity of the ultraviolet light. Without limitations, a masking means for incrementally adjusting the transmissivity of light may be used.

Subsequently, a negative-type green resist (not shown) photosensitive to ultraviolet rays, for example, is formed as a second colored resist on the second planarizing film 21. Subsequently, a green colored microlens 24G, which has a lens shape as illustrated in FIG. 3(e), is formed by using a reticle plate 23 for exposing, which is a masking means for selectively and suitably irradiating ultraviolet light above the light receiving section 12 functioning as a photoelectric conversion section for the Green color. In this case, the reticle plate 23 is a glass negative plate for forming a lens pattern in which the transmissivity of light is incrementally and consecutively adjusted so as to form a lens pattern shape. A convex lens has a center swelled, and therefore, the center of the lens pattern shape can pass the light most. In addition, a masking means for forming a lens pattern can be made by consecutively changing the mesh density of the lens pattern. The green colored microlens 24G is formed such that the peripheral section of the green colored microlens 24G overlaps the peripheral section of the blue colored microlens 24B, so that there will be no gap in between. This can also be achieved easily by adjusting the ultraviolet light irradiated onto the green resist film (not shown) at an appropriate amount. In addition, the desired overlapping amount and microlens shape can also be achieved by adjusting the amount of the ultraviolet light using each masking means.

Subsequently, a negative-type red resist (not shown) photosensitive to ultraviolet rays, for example, is formed as a third colored resist on the second planarizing film 21. Subsequently, a red colored microlens 24R, which has a lens shape as illustrated in FIG. 3(f), is formed by using a reticle plate 23 for exposing, which is a masking means for selectively and suitably irradiating ultraviolet light above the light receiving section 12 functioning as a photoelectric conversion section for the Red color. In this case, the red colored microlens 24R is formed such that the peripheral section of the red colored microlens 24R overlaps the peripheral sections of the blue colored microlens 24B and the green colored microlens 24G, so that there will be no gap in between. This can be easily achieved by adjusting the ultraviolet light irradiated onto the red resist film (not shown) at an appropriate amount. In addition, the desired overlapping amount and microlens shape can also be achieved by adjusting the amount of the ultraviolet light using each masking means.

With the structure described above, the colored microlens array 24, which is colored in the respective colors, is formed above all the light receiving sections 12 functioning as a photoelectric conversion section. When the colored microlens array 24 is in a square shape, the peripheral sections of the lenses overlap with each other in an overlapping section A1 as illustrated in FIG. 4(a). On the other hand, when the colored microlens array 24 is in a round shape, the peripheral sections of the lenses overlap with each other in an overlapping section A2 as illustrated in FIG. 4(b). As a result, there will be no space between the lenses and there will be no gap, so that the lens area will be wider and more light can be focused. Thus, incident light can be effectively used, improving the light receiving sensitivity of each light receiving section 12.

When the colored microlens array 24 is in a round shape, the center of the four colored microlenses becomes vacant lozenge-wise. However, such a vacant portion is smaller compared to the conventional case. Further, since a uniform and optimum lens shape for each color can be obtained, a colored microlens array can be obtained with good uniformity for each color and with high quality and high performance. For example, the green colored microlens 24G can have a larger radius and a higher curvature compared to the blue colored microlens 24B and the red colored microlens 24B in order to increase the light receiving sensitivity of the green color (G). Thus, the lens shapes of a plurality of microlenses can be set in accordance with a plurality of colors of a predetermined color arrangement. The lens shape can be changed optimally in accordance with each color.

Embodiment 2

The colored microlens array according to the present invention and the manufacturing method for the colored microlens array has been described in Embodiment 1. In Embodiment 2, a case will be described where the colored microlens array according to the present invention and the manufacturing method for the colored microlens array are applied for an inner-layer lens. That is, in Embodiment 2, a case will be described where each surface of a plurality of microlenses is an inner-layer microlens provided inside a transparent film.

Figure 5:
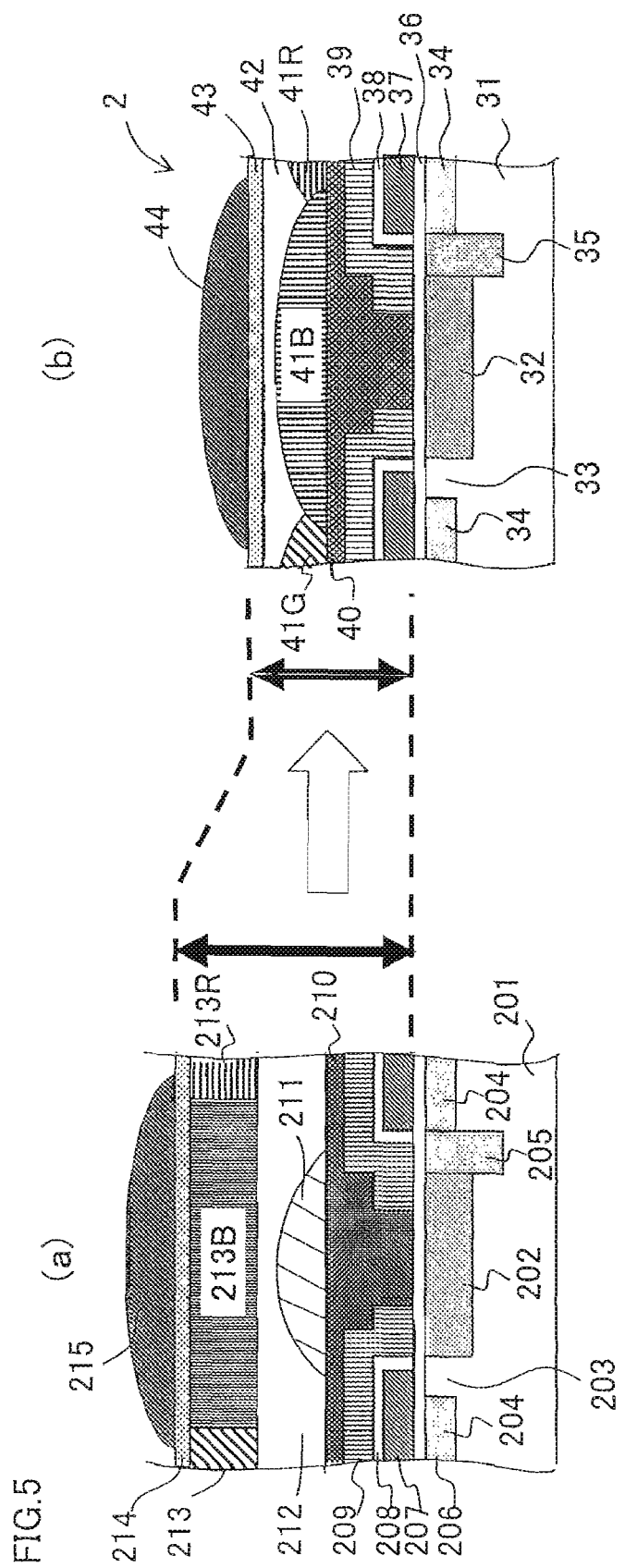
FIG. 5(a) is a longitudinal cross sectional view schematically illustrating an exemplary unit pixel structure of a CCD solid-state image capturing device equipped with an inner-layer microlens formed by a conventional method.
FIG. 5(b) is a longitudinal cross sectional view schematically illustrating an exemplary unit pixel structure of a CCD solid-state image capturing device equipped with an inner-layer colored microlens formed in Embodiment 2 of the present invention.

FIG. 5(a) is a longitudinal cross sectional view schematically illustrating an exemplary unit pixel structure of a CCD solid-state image capturing device equipped with an inner-layer microlens formed by a conventional method. FIG. 5(b) is a longitudinal cross sectional view schematically illustrating an exemplary unit pixel structure of a CCD solid-state image capturing device equipped with an inner-layer colored microlens formed in Embodiment 2 of the present invention. A semiconductor substrate 201, a light receiving section 202, a readout section 203, a CCD charge transfer channel 204, a channel stopper 205, an insulation film 206, a charge transfer electrode 207, an interlayer insulation film 208, a light shielding film 209, a first planarizing film 210, a second planarizing film 214, and a microlens 215 in FIG. 5(a) correspond to a semiconductor substrate 31, a light receiving section 32, a readout section 33, a CCD charge transfer channel 34, a channel stopper 35, an insulation film 36, a charge transfer electrode 37, an interlayer insulation film 38, a light shielding film 39, a first planarizing film 40, a second planarizing film 43, and a microlens 44 of Embodiment 2 illustrated in FIG. 5(b) respectively, and the corresponding parts have the same function and effect, which are substantially the same as those in Embodiment 1 described above.

The difference between the FIG. 5(a) and FIG. 5(b) is an inner-layer lens 211, a planarizing film 212 thereon, a blue color filter 213B, a green color filter 213G and a red color filter 213R illustrated in FIG. 5(a), and a blue colored inner-layer microlens 41B, a green colored inner-layer microlens 41G, a red colored inner-layer microlens 41R, and a planarizing film 42 thereon of Embodiment 2 illustrated in FIG. 5(b). Owing to such a structure, the distance is significantly shortened between the light receiving section 32 and the microlens 44, thereby improving the light receiving sensitivity of the light receiving section 32 significantly.

That is, as a CCD solid-state image capturing device 2, the blue colored inner-layer microlens 41B, the green colored inner-layer microlens 41G, and the red colored inner-layer microlens 41R are provided on the first planarizing film 40 functioning as a transparent film in such a manner to be arranged in a two dimensional matrix corresponding to respective light receiving sections 32. The peripheral sections of the blue colored inner-layer microlens 41B, the green colored inner-layer microlens 41G, and the red colored inner-layer microlens 41R overlap with each other, so that there will be no gap in between. Thus, a wider lens area can be achieved and more incident light can be focused. Therefore, the incident light can be effectively used, improving the light receiving sensitivity of each light receiving section 32.

A manufacturing method will be described for the blue colored inner-layer microlens 41B, the green colored inner-layer microlens 41G, and the red colored inner-layer microlens 41R in the CCD solid-state image capturing device 2 with the structure described above. Herein, the explanation will be given with reference to FIG. 2(c) to FIG. 3(f), as well. The reference number for the members in such a case is denoted in parentheses.

First, a negative-type blue resist 411B photosensitive to ultraviolet rays, for example, is formed as a first colored resist on the first planarizing film 40 as illustrated in FIG. 2(c). Subsequently, a blue colored inner-layer microlens 41B, which has a lens shape as illustrated in FIG. 3(d), is formed by using a reticle plate 45 for exposing, which is a masking means for selectively and suitably irradiating ultraviolet light above the light receiving section 32 functioning as a photoelectric conversion section for the Blue color. In this case, the reticle plate 45 is used as a masking means to consecutively adjust the transmissivity of the ultraviolet light. Without limitations to this, a masking means for incrementally adjusting the transmissivity of light may be used.

Subsequently, a negative-type green resist (not shown) photosensitive to ultraviolet rays, for example, is formed as a second colored resist on the first planarizing film 40. Subsequently, a green colored inner-layer microlens 41G, which has a lens shape as illustrated in FIG. 3(e), is formed by using a reticle plate 45 for exposing, which is a masking means for selectively and suitably irradiating ultraviolet light above the light receiving section 32 functioning as a photoelectric conversion section for the Green color. In this case, the green colored inner-layer microlens 41G is formed such that the peripheral section of the green colored microlens 41G overlaps the peripheral section of the blue colored inner-layer microlens 41B. This can be achieved easily by adjusting the ultraviolet light irradiated onto the green resist film (not shown) at an appropriate amount. In addition, the desired overlapping amount and microlens shape can also be achieved by adjusting the amount of the ultraviolet light using each masking means.

Subsequently, a negative-type red resist (not shown) photosensitive to ultraviolet rays, for example, is formed as a third colored resist on the first planarizing film 40. Subsequently, a red colored inner-layer microlens 41R, which has a lens shape as illustrated in FIG. 3(f), is formed by using a reticle plate 45 for exposing, which is a masking means for selectively and suitably irradiating ultraviolet light above the light receiving section 32 functioning as a photoelectric conversion section for the Red color. In this case as well, the red colored inner-layer microlens 41R is formed such that the peripheral section of the red colored inner-layer microlens 41R overlaps the peripheral sections of the blue colored inner-layer microlens 41B and the green colored inner-layer microlens 41G. This can be easily achieved by adjusting the ultraviolet light irradiated onto the red resist film (not shown) at an appropriate amount. In addition, the desired overlapping amount and microlens shape can also be achieved by adjusting the amount of the ultraviolet light using each masking means.

With the structure described above, the colored inner-layer microlens array 41, which is colored in the respective colors, is formed above all the light receiving sections 32 functioning as a photoelectric conversion section. When the colored inner-layer microlens array 41 is in a square shape, each peripheral section of the lenses overlaps with each other in an overlapping section A1 as illustrated in FIG. 4(a). On the other hand, when the colored inner-layer microlens array 41 is in a round shape, each peripheral section of the lenses overlaps with each other in an overlapping section A2 as illustrated in FIG. 4(*b*). As a result, there will be no space between the lenses and there will be no gap, so that the lens area will be wider and more light can be focused.

Thus, incident light can be effectively used, improving the light receiving sensitivity of each light receiving section 32. In such a case, even when the colored inner-layer microlens array 41 has a peripheral section of a lens overlapping another peripheral section of an adjacent lens, the colored inner-layer microlens array 41 is closer to the light receiving section 32 compared to the microlens 44. Therefore, cross talk rarely occurs due to the overlapping portion of the peripheral sections between adjacent lenses.

In addition, the embodiment can be applied not only to the microlens formed on a surface of a chip, but also to an inner-layer lens as a colored inner-layer microlens array 41, so that the distance can be significantly shortened between the microlens 44 and the light receiving section 32 compared to the conventional method, thereby further increasing the light focusing rate. In addition, due to the colored inner-layer microlens array 41, even light entering obliquely can be focused more to the center of the light receiving section 32, thereby further increasing the light focusing rate.

Embodiment 3

In Embodiments 1 and 2, a case has been described where the colored microlens array according to the present invention and the manufacturing method for the colored microlens array are applied to a CCD solid-state image capturing device (CCD image sensor). In Embodiment 3, a case will be described where the colored microlens array according to the present invention and the manufacturing method for the colored microlens array are applied to a CMOS solid-state image capturing device (CMOS image sensor).

Figure 6:
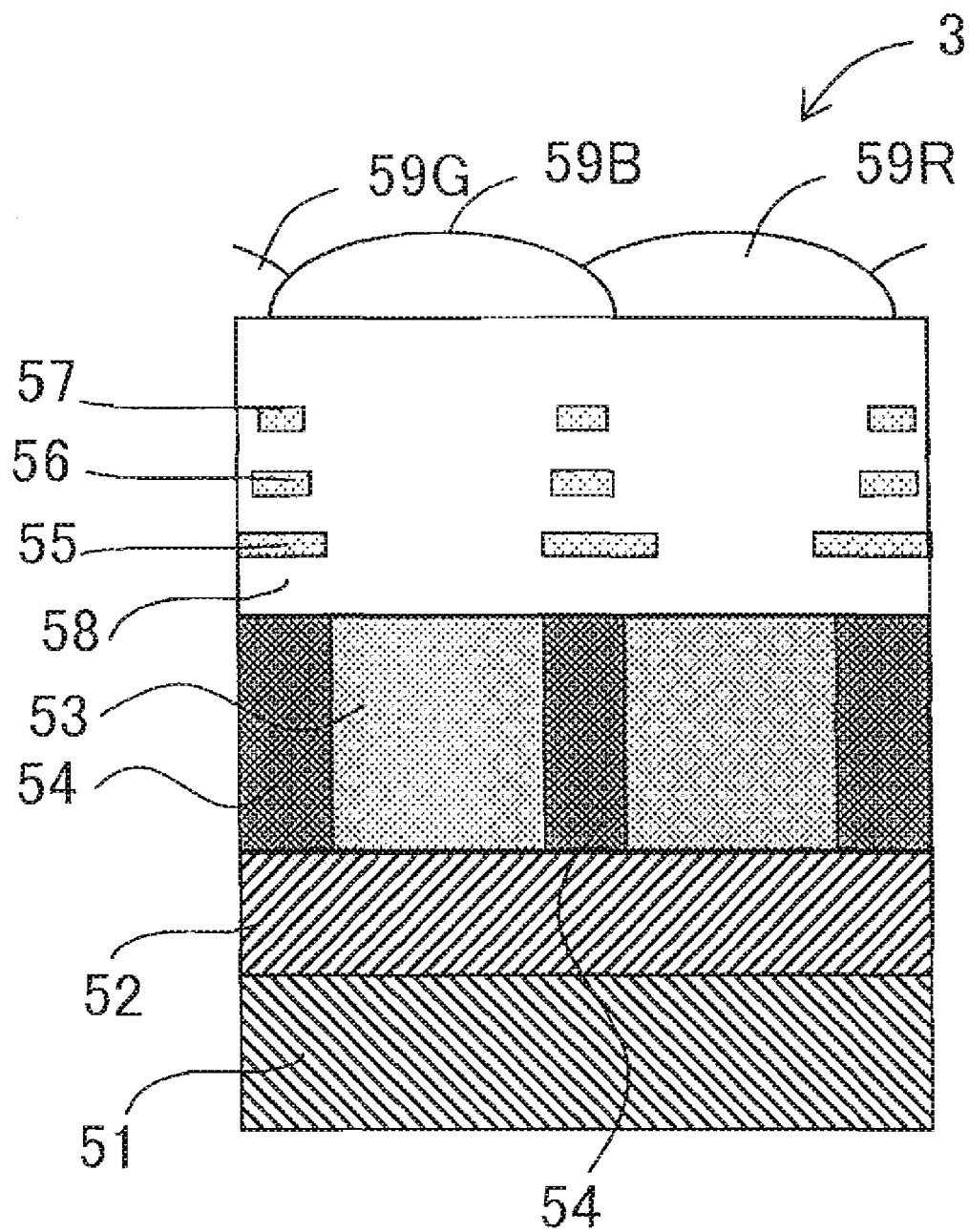
FIG. 6 is a longitudinal cross sectional view schematically illustrating an exemplary two-pixel structure in a CMOS solid-state image capturing device using a colored microlens array according to Embodiment 3 of the present invention.

FIG. 6 is a longitudinal cross sectional view schematically illustrating an exemplary two-pixel structure in a CMOS solid-state image capturing device using a colored microlens array according to Embodiment 3 of the present invention.

In FIG. 6, a CMOS solid-state image capturing device 3 according to Embodiment 3 includes a P-type well region 52 formed on an N-type substrate 51, a light receiving section 53, which is composed of an N-type region, for forming a photodiode in the P-type well region 52, and a P-type separation region 54, which has a higher concentration than the P-type well region 52 and is provided around the light receiving section 53. Further, as a multi-layered wiring layer used for the light receiving section 53, which functions as a pixel section, to read out a signal, a first-layer metal wiring layer 55, a second-layer metal wiring layer 56 and a third-layer metal wiring layer 57 are provided by being embedded in this order in an interlayer insulation film 58. Further, a surface of the interlayer insulation film 58 is planarized, and a colored microlens array 59 for focusing light on the light receiving section 53 is provided on the interlayer insulation film 58.

That is, as the CMOS solid-state image capturing device 3, a colored microlens array 59, which is constituted of a blue colored microlens 59B, a green colored microlens 59G, and a red colored microlens 59R, is provided on the interlayer insulation film 58 (first planarizing film) functioning as a transparent film, the microlenses 59B, 59G, and 59R arranged in a two dimensional matrix in a corresponding manner to respective light receiving sections 53. The peripheral sections of the blue colored microlens 59B, the green colored microlens 59G, and the red colored microlens 59R overlap with each other. As a result, there will be no space between the lenses and there will be no gap, so that the lens area will be wider and more light can be focused. Thus, incident light can be effectively used, improving the light receiving sensitivity of each light receiving section 53.

The distance between the microlens and the light receiving section can be significantly shortened compared to the conventional method because the colored microlens has combined functions of a color filter and a microlens. The distance between the microlens and the light receiving section is longer in the CMOS solid-state image capturing device compared to that of the CCD solid-state image capturing device by the thickness of the multi-layered wiring layer, so that the light focusing rate can be increased so as to improve the light receiving sensitivity of the light receiving section.

Conventionally, it is difficult to melt a color filter to form a lens shape by heat. It is also difficult to form such a color filter into a lens shape by etching. On the other hand, according to Embodiments 1 to 3, an appropriate amount of ultraviolet rays is selectively irradiated at a predetermined portion of the color filter, or appropriate amount of ultraviolet rays is selectively irradiated by a masking means for adjusting the transmissivity of light incrementally or continuously as necessary. Subsequently, a developing process is performed for the color filter irradiated with ultraviolet rays so as to form the surface in a lens shape. As a result, the colored microlens array can be obtained easily and accurately with good uniformity for each color and with high quality and high performance.

Note that the manufacturing method is the same as the case in Embodiment 1 described above, for the blue colored microlens 59B, the green colored microlens 59G and the red colored microlens 59R in the CMOS solid-state image capturing device 3 with the structure described above.

Herein, the characteristics of the CMOS image sensor and the CCD image sensor will be briefly described.

The CMOS image sensor, unlike the CCD image sensor, does not use a CCD for transferring a signal charge from each light receiving section with a vertical transfer section and transferring the signal charge from the vertical transfer section in a horizontal direction with a horizontal transfer section. Instead, the CMOS image sensor reads out a signal charge from the light receiving section for each pixel with a selection control line formed by an aluminum wiring like a memory device and converts the signal charge into voltage. Subsequently, the CMOS image sensor successively reads out an imaging signal amplified in accordance with the converted voltage from a selected pixel. On the other hand, the CCD image sensor requires a plurality of positive and negative power supply voltages for driving a CCD, whereas the CMOS image sensor is capable of driving itself with a single power supply, which enables a low electric consumption and low voltage driving compared with the CCD image sensor. Further, because a unique CCD manufacturing process is used for manufacturing the CCD image sensor, it is difficult to apply a manufacturing process generally used for a CMOS circuit directly to the manufacturing method for the CCD image sensor. On the other hand, the CMOS image sensor uses a manufacturing process generally used for the CMOS circuit. Therefore, a logic circuit, an analog circuit and an analog-digital conversion circuit and the like can be simultaneously formed by the CMOS process that is frequently used for manufacturing a driver circuit for controlling a display, a driver circuit for controlling image capturing, a semiconductor memory such as DRAM, and a logic circuit. That is, it is easy to form a CMOS image sensor on a same semiconductor chip on which a semiconductor memory, a driver circuit for controlling a display, and a driver circuit for controlling image capturing are formed. In addition, with respect to the manufacturing for the CMOS image sensor, it is easy for the CMOS image sensor to share a production line with the semiconductor memory, the driver circuit for controlling a display, and the driver circuit for controlling image capturing.

Embodiment 4

Figure 7:
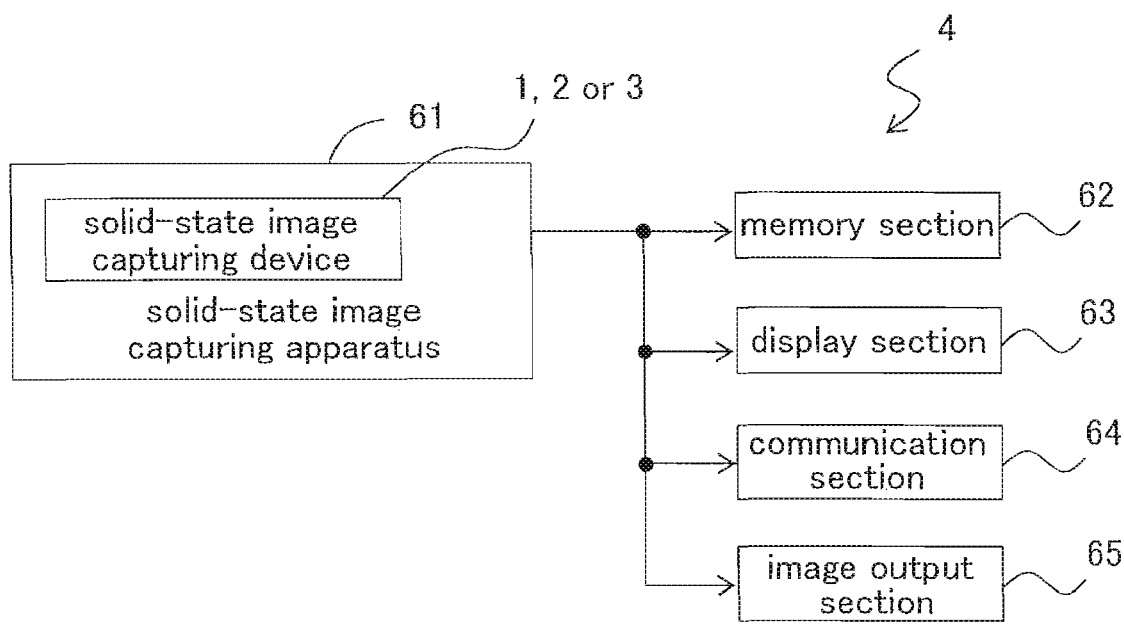
FIG. 7 is a block diagram illustrating an exemplary diagrammatic structure of an electronic information device, as Embodiment 4 of the present invention, using a solid-state image capturing device according to any of Embodiments 1 to 3 of the present invention as an image input device in an image capturing section.
Figure 9:
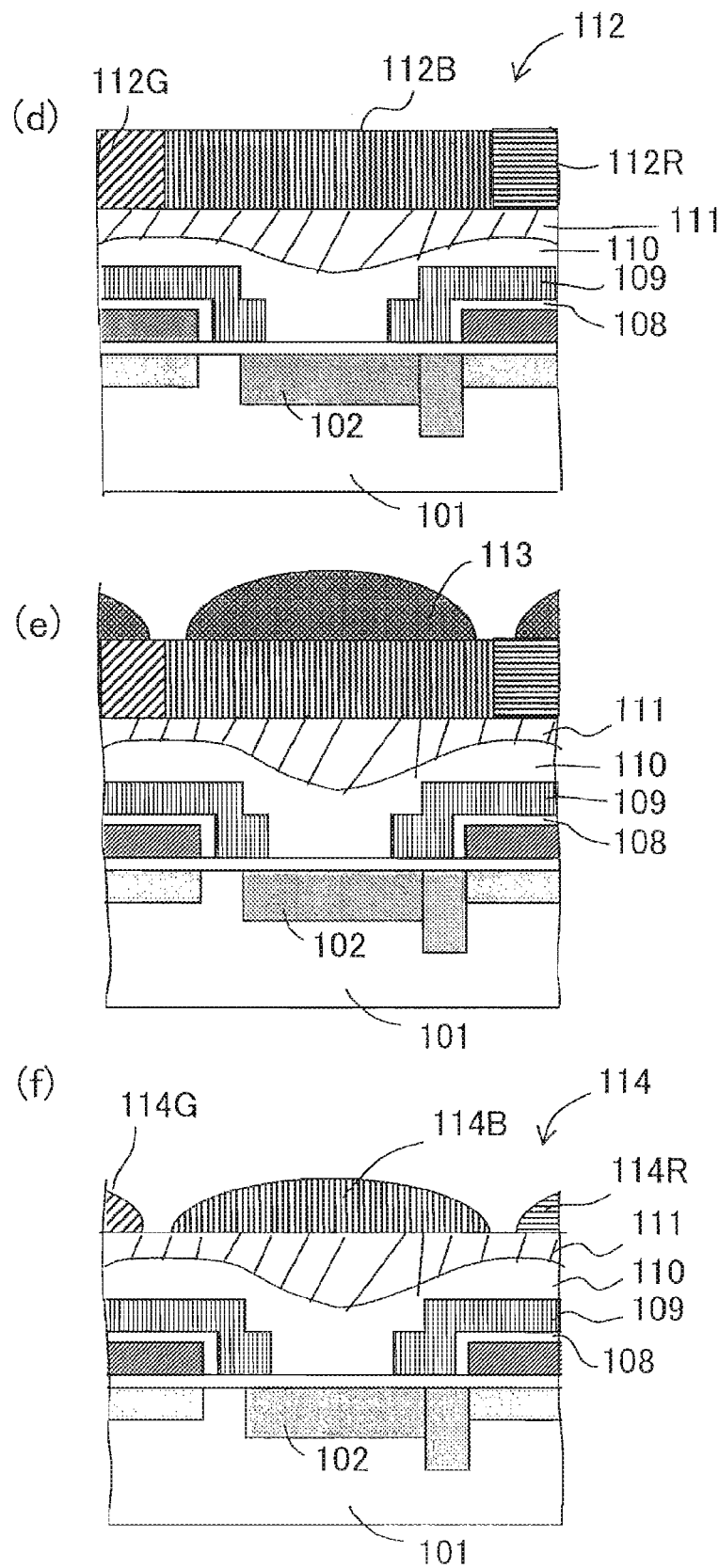
FIGS. 9(d) to (f) are longitudinal cross sectional views schematically illustrating an exemplary unit pixel to describe respective steps (latter half) of a conventional manufacturing method for the CCD solid-state image capturing device.

FIG. 7 is a block diagram illustrating an exemplary diagrammatic structure of an electronic information device, as Embodiment 4 of the present invention, using a solid-state image capturing device according to any of Embodiments 1 to 3 of the present invention as an image input device in an image capturing section.

In FIG. 7, the electronic information device 4 according to Embodiment 4 of the present invention includes: any of the solid-state image capturing devices 1 to 3 according to Embodiment 1 to 3; a solid-state image capturing apparatus 61 for performing predetermined signal processing on a color image capturing signal from any one of the solid-state image capturing devices 1 to 3 to output a color image signal; a memory section 62 (e.g., recording media) for data-recording a color image data from the solid-state image capturing apparatus 61 after a predetermined signal process is performed on the image data for recording; a display section 63 (e.g., a color liquid crystal display apparatus and a color EL display apparatus) for displaying the color image data from the solid-state image capturing apparatus 61 on a display screen (e.g., liquid crystal display screen) after predetermined signal processing is performed on the color image data for display; a communication section 64 (e.g., a transmitting and receiving device) for communicating the color image signal from the solid-state image capturing apparatus 61 after predetermined signal processing is performed on the image signal for communication; and an image output section 65 for printing the color image signal from the solid-state image capturing apparatus 61 after predetermined signal processing is performed for printing. Thus, the electronic information device 4 according to Embodiment 4 may include all of the memory section 62, the display section 63, the communication section 64, and the image output section 65. Without any limitations to this, the electronic information device may include any of these sections.

As the electronic information device 4, an electronic information device that has an image input device is conceivable, such as a digital camera (e.g., digital video camera and digital still camera), an image input camera (e.g., a monitoring camera, a door phone camera, a camera equipped in a vehicle, and a television camera), a scanner, a facsimile machine and a camera-equipped cell phone device.

Therefore, according to Embodiment 4 of the present invention, the color image signal from the solid-state image capturing apparatus 61 can be displayed on a display screen finely, printed out (printing) on a sheet of paper using an image output section 65, communicated finely as communication data via a wire or a radio; stored finely at the memory section 62 by performing predetermined data compression processing; and various data processes can be finely performed.

According to Embodiments 1 to 3 with the structure described above, a photosensitive material, which is colored with pigment or dye as necessary, is evenly formed on the second planarizing film 21, which is a transparent film provided on the substrate. An appropriate amount of ultraviolet rays is selectively irradiated at a predetermined portion of the photosensitive material using a reticle plate and the like, the reticle plate functioning as a masking means for selectively irradiating an appropriate amount of ultraviolet rays at a predetermined portion of the photosensitive material or for adjusting the transmissivity of light incrementally or continuously as necessary so as to form a lens pattern shape. Subsequently, a developing process is performed for the photosensitive material irradiated with ultraviolet rays so as to form the surface in a lens shape. As a result, the blue colored microlens 24B, the green colored microlens 24G, and the red colored microlens 24R, are consecutively arranged as the colored microlens array 24. In the microlens array, the peripheral sections of respective microlenses overlap with each other and have a microlens shape that meets a required performance of the device and in accordance with each color. With such a structure, an optimum lens shape can be obtained with zero space between adjacent microlenses and with uniformity for each lens.

In Embodiments 1 to 4, a case has been described where the colored microlens array according to the present invention and the manufacturing method of colored microlens array are applied to a CCD image sensor (CCD solid-state image capturing device) and a CMOS image sensor (CMOS solid-state image capturing device). However, the colored microlens array and the manufacturing method can be applied to other devices, such as afore-mentioned color liquid crystal display device (color liquid crystal display apparatus) and color EL display apparatus Similar to Embodiments 1 to 4 described above, a colored microlens array with a desired shape can be easily obtained by adjusting the ultraviolet light with masking means in forming respective colored microlenses.

Although not specifically described in Embodiments 1 to 4, the objective of the present invention, to obtain a uniform and optimum lens shape for each color with zero space between adjacent microlenses, can be achieved by having a plurality of microlenses for focusing incident light at a plurality of respective positions, on a substrate or a transparent film provided on the substrate and arranging the plurality of microlenses in such a manner that the peripheral sections of the microlenses overlap each other in respective adjacent positions, the microlenses are colored in a plurality of colors, and the microlenses are arranged in a predetermined color arrangement. In such a case, Bayer arrangement with primary colors is used as a predetermined color arrangement in Embodiments 1 to 4. Without any limitations to this, the color arrangement can be with complementary colors, such as cyan, yellow and magenta. Further, magenta, one color among the plurality of colors can be colorless with no coloring in the color arrangement with the complementary colors. Further, pigment or dye can be dispersed in the plurality of microlenses, or coloring matter can be included.

As described above, the present invention is exemplified by the use of its preferred Embodiments 1 to 4. However, the present invention should not be interpreted solely based on Embodiments 1 to 4 described above. It is understood that the scope of the present invention should be interpreted solely based on the claims. It is also understood that those skilled in the art can implement an equivalent scope of technology, based on the description of the present invention and common knowledge from the description of the detailed preferred Embodiments 1 to 4 of the present invention. Furthermore, it is understood that any patent, any patent application and any references cited in the present specification should be incorporated by reference in the present specification in the same manner as the contents are specifically described therein.

INDUSTRIAL APPLICABILITY

The present invention can be applied in the field of a colored microlens array for focusing incident light on a plurality of locations by a predetermined color arrangement such as Bayer arrangement and a manufacturing method for the colored microlens array. In particular, the present invention can be applied in the field of a colored microlens array for a colored microlens and an inner-layer lens used for a color solid-state image capturing apparatus constituted of semiconductor elements for performing photoelectric conversion on and capturing image light from a subject and used for a color liquid crystal display apparatus, and a manufacturing method for the colored microlens array; a color solid-state image capturing device using the colored microlens array and a manufacturing method for the color solid-state image capturing device; a color display apparatus such as a color liquid crystal display apparatus using the colored microlens array and a manufacturing method for the color display apparatus; and an electronic information device, such as a digital camera (e.g., digital video camera and digital still camera), an image input camera, a scanner, a facsimile machine and a camera-equipped cell phone device, having the color solid-state image capturing device as an image input device used in an image capturing section of the electronic information device. According to the present invention, a photosensitive material, which is colored with pigment or dye as necessary, is evenly formed on a substrate or a transparent film provided on the substrate. An appropriate amount of ultraviolet rays is selectively irradiated at a predetermined portion of the photosensitive material, or appropriate amount of ultraviolet rays is selectively irradiated by a masking means for adjusting the transmissivity of light incrementally or continuously as necessary. Subsequently, a developing process is performed for the photosensitive material irradiated with ultraviolet rays so as to form the surface in a lens shape. As a result, the peripheral sections of respective microlenses overlap with each other, and such a microlens shape meets a required performance of the device. The distance between the microlens and the light receiving section becomes short and desirable. With such a structure, the colored microlens array can be obtained with good uniformity for each color and with high quality and high performance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for manufacturing a colored microlens array, comprising:
    a photosensitive material forming step of evenly forming a photosensitive material colored with pigment or dye, on a substrate or a transparent film formed on the substrate;
    a lens shape forming step of irradiating light selectively on a predetermined portion of the photosensitive material and subsequently performing development processing to form a surface of the photosensitive material into a lens shape; and
    wherein a masking means having light transmissivity adjusted incrementally and consecutively by a light shielding film is used in the lens shape forming step so as to form a plurality of microlenses into respective lens shapes when the surface of the photosensitive material is formed into a lens shape by selectively irradiating light on a predetermined portion of the photosensitive material.

2. A method for manufacturing a colored microlens array according to claim 1, wherein the plurality of microlens are formed such that the peripheral sections of the adjacent microlenses overlap each other and the microlenses are colored in a plurality of colors and arranged in a predetermined color arrangement.

3. A method for manufacturing a colored microlens array according to claim 2, wherein, in the plurality of microlenses, the lens shape is formed in accordance with the plurality of colors in the color arrangement.

4. A colored microlens array that is manufactured by the method for manufacturing a colored microlens array according to claim 1.

5. A color solid-state image capturing device, comprising a plurality of light receiving elements provided in two dimensions for performing photoelectric conversion on image light from a subject, wherein a colored microlens array according to claim 4 is provided above light receiving sections with a transparent film interposed therebetween, for focusing incident light on light receiving sections.

6. A color solid-state image capturing device according to claim 5, wherein the color solid-state image capturing device is a CCD color solid-state image capturing device, in which a photoelectrically converted signal charge in each of the light receiving elements is read out in a charge transfer section to be consecutively transferred in a predetermined direction.

7. A color solid-state image capturing device according to claim 5, wherein the color solid-state image capturing device is a CMOS color solid-state image capturing device, in which a photoelectrically converted signal charge in each of the light receiving elements is transferred to a charge detection section, and the signal charge is converted into voltage in the charge detection section to be amplified in accordance with the converted voltage and outputted as an image capturing signal.

8. A method for manufacturing a color solid-state image capturing device comprising a plurality of light receiving elements provided in two dimensions for performing photoelectric conversion on image light from a subject, the method comprising a step of forming a colored microlens array by a method for manufacturing a colored microlens array according to claim 1.

9. A method for manufacturing a color solid-state image capturing device according to claim 8, wherein the method for manufacturing a color solid-state image capturing device is a method for manufacturing a CCD color solid-state image capturing device, in which a photoelectrically converted signal charge in each of the light receiving elements is read out in a charge transfer section to be consecutively transferred in a predetermined direction.

10. A method for manufacturing a color solid-state image capturing device according to claim 8, wherein the method for manufacturing a color solid-state image capturing device is a method for manufacturing a CMOS color solid-state image capturing device, in which a photoelectrically converted signal charge in each of the light receiving elements is transferred to a charge detection section, and the signal charge is converted into voltage in the charge detection section to be amplified in accordance with the converted voltage and outputted as an image capturing signal.

11. A color solid-state image capturing device manufactured by a method for manufacturing a color solid-state image capturing device according to claim 8.

12. A color display apparatus having a colored microlens in a colored microlens array according to claim 4, provided for each display pixel in a display panel.

13. A method for manufacturing a color display apparatus, comprising a step of forming a colored microlens array by a method for manufacturing a colored microlens array according to claim 1, wherein each colored microlens in the colored microlens array is formed in a display panel for each display pixel.

14. An electronic information device using a color solid-state image capturing device according to claim 5 as an image input device in an image capturing section.

* * * * *